United States Patent
Dahlin

(10) Patent No.: US 6,943,639 B2
(45) Date of Patent: Sep. 13, 2005

(54) ARRANGEMENT FOR LOW POWER CLOCK GENERATION

(75) Inventor: Jan Dahlin, Järfälla (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/004,130

(22) Filed: Dec. 3, 2004

(65) Prior Publication Data

US 2005/0083141 A1 Apr. 21, 2005

Related U.S. Application Data

(63) Continuation of application No. PCT/SE03/00821, filed on May 21, 2003.

(30) Foreign Application Priority Data

Jun. 7, 2002 (SE) .............................................. 2017747

(51) Int. Cl.[7] .............................. H03B 5/32; H03B 5/36
(52) U.S. Cl. ................... 331/183; 331/74; 331/116 FE; 331/158; 331/173; 331/177 R; 331/177 V
(58) Field of Search ........................ 331/60–61, 74–76, 331/109, 116 R, 116 FE, 158–160, 173, 177 R, 177 V, 182–183

(56) References Cited

U.S. PATENT DOCUMENTS

| 4,782,309 A | 11/1988 | Benjaminson .............. 331/139 |
| 6,052,036 A | * 4/2000 | Enstrom et al. ............. 331/176 |

FOREIGN PATENT DOCUMENTS

| JP | 09-102714 | 4/1997 | ............ H03B/5/32 |
| JP | 2000-010651 | 1/2000 | ............ G06F/1/06 |
| JP | 2002-091606 | 3/2002 | ............ G06F/1/08 |

* cited by examiner

Primary Examiner—David Mis
(74) Attorney, Agent, or Firm—Baker Botts L.L.P.

(57) ABSTRACT

A high accuracy crystal oscillator for generating a clock signal comprises a gain stage (2) controlled by a current from a current source (5), and a trimmable load capacitance (3, 4). To generate a low power clock signal, a mode control unit (7) is provided for disconnecting at least part of the load capacitance (3, 4) and activating an oscillation amplitude regulator (6) that is connected between the input terminal of the gain stage (2) and the current source (5) to reduce the current to the gain stage (2) to such a value that oscillation is maintained with a minimum amplitude.

11 Claims, 1 Drawing Sheet

ARRANGEMENT FOR LOW POWER CLOCK GENERATION

CROSS-REFERENCE TO RELATED APPLICATION

This application is a continuation of copending International Application No. PCT/SE03/00821 filed May 21, 2003 which designates the United States, and claims priority to Swedish application no. 0201774-7 filed Jun. 7, 2002.

TECHNICAL FIELD OF THE INVENTION

The invention relates generally to clock signal oscillators and more specifically to an arrangement for low power clock signal generation in such oscillators.

BACKGROUND OF THE INVENTION

In a radio transceiver in e.g. a Bluetooth system, a high frequency, e.g. 13 MHz, clock signal is needed for different operating modes such as transmit, receive, etc. Since high frequency accuracy, typically +/-10 ppm, is required in transmit and receive modes, this 13 MHz clock signal is generated by means of an accurate crystal oscillator. During sleep mode of the radio transceiver, i.e. when there are no transmit or receive operations, only a low frequency, e.g. 3.2 kHz, clock signal, with a lower frequency accuracy requirement, typically +/-250 ppm, is needed and low power consumption is desired.

It is known to generate the 3.2 kHz clock signal by means of a separate RC oscillator. However, even with trimming implemented RC oscillators have problems in achieving frequency accuracy over time and temperature.

It is also known to add a second crystal of a low frequency, e.g. 32 kHz, to create the low power clock signal. However, an additional crystal means additional costs.

Moreover, it is known to generate the 3.2 kHz clock signal by dividing the frequency of the 13 MHz clock signal. However, running the 13 MHz crystal oscillator at full power also in sleep mode would increase the power consumption of the radio transceiver too much.

SUMMARY OF THE INVENTION

The object of the invention is to provide an arrangement for generating a clock signal with less power in a high accuracy crystal oscillator that comprises a gain stage controlled by a current from a current source, and a trimmable load capacitance.

This can be attained in that the arrangement according to the invention comprises a mode control unit for disconnecting at least part of the load capacitance and activating an oscillation amplitude regulator that is connected between the input terminal of the gain stage and the current source to reduce the current to the gain stage to such a value that oscillation is maintained with a minimum amplitude.

Hereby, the power consumption will be reduced.

BRIEF DESCRIPTION OF THE DRAWING

The invention will be described more in detail below with reference to the appended drawing on which

DESCRIPTION OF THE INVENTION

Figure 1:
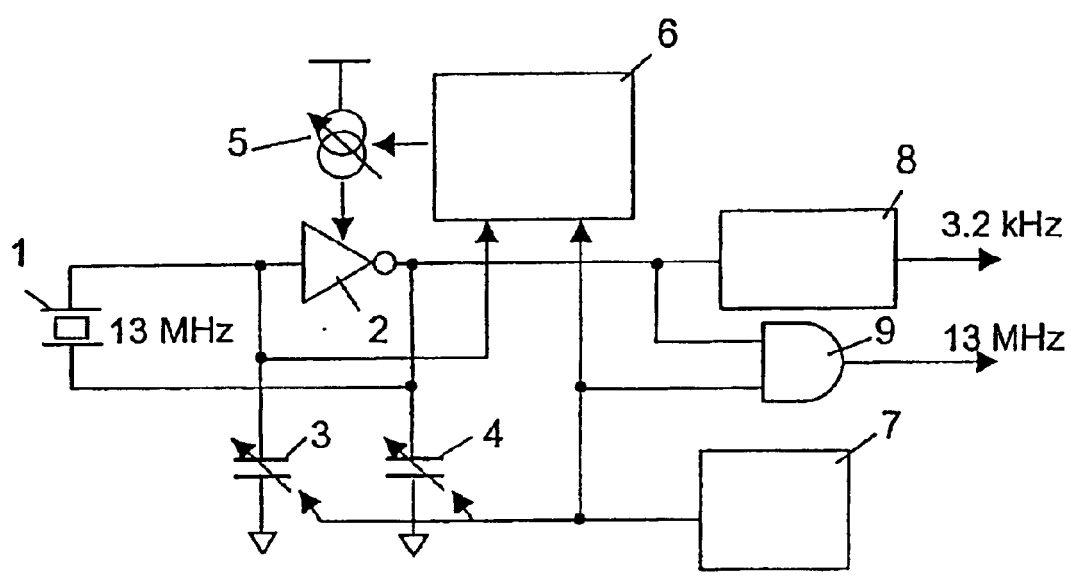
FIG. 1 is a simplified schematic of an oscillator circuit with an embodiment of an arrangement according to the invention.

FIG. 1 is a simplified schematic of a 13 MHz crystal oscillator circuit that comprises a crystal 1. The crystal 1 is connected with one of its terminals to an input terminal of a gain stage 2 and to ground via a trimmable load capacitance 3, and with its other terminal to an output terminal of the gain stage 2 and to ground via a trimmable load capacitance 4. By trimming the load capacitance 3, 4, high frequency accuracy, typically +/-10 ppm, is achieved.

The gain of the gain stage 2 is proportional to the current supplied by a variable current source 5 to the gain stage 2. In addition, the oscillation amplitude at the output of the gain stage 2 is a function of its gain, i.e. the higher gain, the higher oscillation amplitude.

In accordance with the invention, an oscillation amplitude regulator 6 is connected with its input terminal to the input terminal of the gain stage 2, with its output terminal to a control input terminal of the current source 5, and with a control input terminal to an output terminal of a mode control unit 7.

The oscillation amplitude is also a function of load capacitance, i.e. the less load capacitance, the higher oscillation amplitude is achieved for a certain gain. Therefore, the output terminal of the mode control unit 7 is also connected to control input terminals of the trimmable load capacitance 3, 4 making it possible to disconnect all or at least part of the load capacitance in sleep mode.

In the embodiment in FIG. 1, a frequency divider 8 is connected to the output terminal of the oscillator 2 to provide a 3.2 kHz clock signal. The divider 8 is running in all operating modes, including sleep mode, since the 3.2 kHz clock is needed all the time.

By means of the mode control unit 7, the oscillator circuit can be switched between an operating mode and a sleep mode.

In operating mode, i.e. when the 13 MHz clock signal is needed, the power consumption is high. This is due to the facts that the load capacitance needs to be trimmed to achieve the required frequency accuracy, and relatively high oscillation amplitude is needed for a low jitter of the 13 MHz clock signal.

In accordance with the invention, to reduce the power consumption of the oscillator circuit in sleep mode, i.e. when only the 3.2 kHz clock signal is needed, the mode control unit 7 is adapted to generate a control signal to disconnect at least part of the load capacitance 3, 4. By disconnecting part of the load capacitance 3, 4, less current will be needed from the current source 5 to the gain stage 2 to achieve a certain oscillation amplitude.

The load capacitance 3, 4 can be decreased since the accuracy requirements for the 3.2 kHz clock signal are relatively low, e.g. 250 ppm. The lesser load capacitance, the higher frequency error but less current is required for maintaining oscillation.

The control signal from the mode control unit 7 is also applied to the oscillation amplitude regulator 6 that is activated to reduce the current from the current source 5 to the gain stage 2 to such a value that oscillation is maintained with a minimum amplitude sufficient for proper frequency division performed by the divider 8.

The 13 MHz clock signal can be blocked in sleep mode by means of e.g. a gate. In the embodiment in FIG. 1, this is done by an AND gate 9 that is connected with its one input terminal to the output terminal of the gain stage 2 and with its other input terminal to the output terminal of the mode control unit 7.

I claim:

1. An arrangement in a high accuracy crystal oscillator for generating a low power clock signal, the oscillator comprising a gain stage (2) controlled by a current from a current source (5), and a trimmable load capacitance (3, 4), wherein the arrangement comprises a mode control unit (7) for disconnecting at least part of the load capacitance (3, 4) and activating an oscillation amplitude regulator (6) that is connected between an input terminal of the gain stage (2) and the current source (5) to reduce the current to the gain stage (2) to such a value that oscillation is maintained with a minimum amplitude.

2. The arrangement according to claim 1, wherein a frequency divider (8) is connected to an output terminal of the gain stage (2) to provide a low frequency low power clock signal.

3. The arrangement according to claim 2, wherein a gate (9) is connected with its one input terminal to the output terminal of the gain stage (2) and with its other input terminal to the mode control unit (7) to block the output of the gate (9) when the low frequency low power clock signal is provided.

4. The arrangement according to claim 3, wherein the gate (9) is an AND gate.

5. A high accuracy crystal oscillator for generating a low power clock signal, comprising:
   a current source,
   a gain stage (2) controlled by the current,
   a trimmable load capacitance (3, 4),
   an oscillation amplitude regulator connected between an input terminal of the gain stage (2) and the current source (5),
   a mode control unit (7) for disconnecting at least part of the load capacitance (3, 4) and activating the oscillation amplitude regulator (6) to reduce the current to the gain stage (2) to such a value that oscillation is maintained with a minimum amplitude.

6. The oscillator according to claim 5, wherein a frequency divider (8) is connected to an output terminal of the gain stage (2) to provide a low frequency low power clock signal.

7. The oscillator according to claim 6, wherein a gate (9) is connected with its one input terminal to the output terminal of the gain stage (2) and with its other input terminal to the mode control unit (7) to block the output of the gate (9) when the low frequency low power clock signal is provided.

8. The oscillator according to claim 7, wherein the gate (9) is an AND gate.

9. A high accuracy crystal oscillator for generating a low power clock signal, comprising:
   a current source,
   a gain stage (2) controlled by the current,
   a trimmable load capacitance (3, 4),
   an oscillation amplitude regulator connected between an input terminal of the gain stage (2) and the current source (5),
   a frequency divider connected to an output terminal of the gain stage (2) to provide a low frequency low power clock signal,
   a mode control unit (7) for disconnecting at least part of the load capacitance (3, 4) and activating the oscillation amplitude regulator (6) to reduce the current to the gain stage (2) to such a value that oscillation is maintained with a minimum amplitude.

10. The oscillator according to claim 9, wherein a gate (9) is connected with its one input terminal to the output terminal of the gain stage (2) and with its other input terminal to the mode control unit (7) to block the output of the gate (9) when the low frequency low power clock signal is provided.

11. The oscillator according to claim 10, wherein the gate (9) is an AND gate.

* * * * *